US012672398B2

(12) United States Patent
Cho et al.

(10) Patent No.:     US 12,672,398 B2
(45) Date of Patent:          Jun. 30, 2026

(54) DISPLAY DEVICE WITH A SOURCE-DRAIN ELECTRODE PATTERN INCLUDING A RING-SHAPED BYPASS PORTION BYPASSING A CENTRAL PORTION OF THE EMISSION AREA

(71) Applicant: LG Display Co., Ltd., Seoul (KR)

(72) Inventors: SeungWan Cho, Paju-si (KR);
ChangSeung Woo, Paju-si (KR);
DongMin Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 680 days.

(21) Appl. No.: 17/978,748

(22) Filed: Nov. 1, 2022

(65) Prior Publication Data

US 2023/0197898 A1      Jun. 22, 2023

(30) Foreign Application Priority Data

Dec. 22, 2021     (KR) ........................ 10-2021-0184704

(51) Int. Cl.
H10H 20/831          (2025.01)
H10H 20/857          (2025.01)
H10H 29/14          (2025.01)
(52) U.S. Cl.
CPC ........ H10H 20/831 (2025.01); H10H 20/857 (2025.01); H10H 29/142 (2025.01)
(58) Field of Classification Search
CPC ... H10H 20/831; H10H 20/857; H10H 29/142
See application file for complete search history.

(56) References Cited

U.S. PATENT DOCUMENTS

| | | | |
|---|---|---|---|
| 8,912,547 | B2 | 12/2014 | Matsukura |
| 2013/0187187 | A1 | 7/2013 | Matsukura |
| 2016/0035745 | A1 | 2/2016 | Li |
| 2016/0300899 | A1 | 10/2016 | Zhang |
| 2020/0194509 | A1 | 6/2020 | Beak et al. |
| 2021/0083034 | A1* | 3/2021 | Bang .................... H10K 59/124 |
| 2021/0273195 | A1 | 9/2021 | Lee et al. |

FOREIGN PATENT DOCUMENTS

| | | |
|---|---|---|
| CN | 104779272 A | 7/2015 |
| CN | 110752221 A | 2/2020 |
| CN | 111326546 A | 6/2020 |
| CN | 112530995 A | 3/2021 |
| CN | 113488601 A | 10/2021 |
| CN | 113690392 A | 11/2021 |
| GB | 503762 A | 4/1939 |

(Continued)

OTHER PUBLICATIONS

Taiwan Intellectual Property Office, Office Action, Taiwanese Patent Application No. 113114359, Jul. 3, 2024, 11 pages.

(Continued)

*Primary Examiner* — Norman D Richards
*Assistant Examiner* — Sammantha K Salaz
(74) *Attorney, Agent, or Firm* — Fenwick & West LLP

(57) ABSTRACT

A display device includes a first source-drain electrode pattern which includes a first bypass portion having a ring shape and bypassing a central portion of an emission area, thereby reducing a rainbow mura phenomenon from occurring by light reflected from a pixel electrode.

27 Claims, 15 Drawing Sheets

| | |
|---|---|
| ⬚ 220 | ▨ 340 |
| ▧ 330 | ▦ BANK |

(56)        References Cited

FOREIGN PATENT DOCUMENTS

| | | |
|---|---|---|
| JP | 2009-186566 A | 8/2009 |
| JP | 2009-237508 A | 10/2009 |
| JP | 2019-194712 A | 11/2019 |

OTHER PUBLICATIONS

The Japan Patent Office, Office Action, Japanese Patent Application No. 2022-200169, Dec. 19, 2023, seven pages.
European Patent Office, Extended European Search Report, European Patent Application No. 22206611.0, May 24, 2023, eight pages.
Taiwan Intellectual Property Office, Office Action, Taiwanese Patent Application No. 111145995, Aug. 11, 2023, 13 pages.
China National Intellectual Property Administration, Office Action, Chinese Patent Application No. 202211412655.0, Aug. 1, 2025, 16 pages.

* cited by examiner

| | | | |
|---|---|---|---|
| 220 | | 340 | |
| 330 | | BANK | |

330

330

| | |
|---|---|
| ∷∷∷ | 220 |
| ▨ | 531 |
| ▦ | BANK |

DISPLAY DEVICE WITH A SOURCE-DRAIN ELECTRODE PATTERN INCLUDING A RING-SHAPED BYPASS PORTION BYPASSING A CENTRAL PORTION OF THE EMISSION AREA

CROSS REFERENCE TO RELATED APPLICATION

This application claims priority from Republic of Korea Patent Application No. 10-2021-0184704, filed on Dec. 22, 2021, which is hereby incorporated by reference in its entirety.

BACKGROUND

1. Field of Technology

Embodiments of the present disclosure relate to a display device.

2. Description of the Related Art

A display device is required to have low reflectance with respect to external light such that a user can easily identify information displayed on the display device even under a condition in which the external light is present.

A display device may include a plurality of pixels including light-emitting elements and various circuit elements for driving the light-emitting elements. However, when external light is reflected by various material layers constituting the light-emitting elements and the circuit elements, it is difficult for a user using the display device to identify information displayed on the display device.

Conventional display devices have used a polarization plate to lower reflectance with respect to external light. When a polarization plate is used, reflectance with respect to external light can be effectively lowered, but the polarization plate is an expensive material that increases manufacturing costs of a display device, and there is a limitation in reducing the thickness of the display device. In addition, when light emitted from a light-emitting element passes through the polarization plate, there is a problem in that brightness decreases.

SUMMARY

In the field of display technology, a technology for implementing low reflectance without using an expensive polarization plate that significantly reduces the brightness of a display device is being studied. However, when a polarization plate is omitted, there has been a problem in that a so-called rainbow mura phenomenon occurs due to light reflected from circuit elements constituting a pixel. Accordingly, a display device capable of suppressing a rainbow mura phenomenon while improving the brightness of the display device without using a polarization plate is disclosed.

In one embodiment, a display device comprises: an emission area; a pixel electrode including at least a portion that is in the emission area; and a first source-drain electrode pattern comprising a first bypass portion which has a ring shape that bypasses a central portion of the emission area.

In one embodiment, a display device comprises: a substrate including an emission area; a pixel electrode in the emission area; a first source-drain electrode pattern that is electrically connected to the pixel electrode, the first source-drain pattern including a portion that surrounds a portion of the pixel electrode that is between ends of the pixel electrode such that the first source-drain electrode pattern is non-overlapping with the portion of the pixel electrode.

In one embodiment, a display device comprises: a substrate; a bank on the substrate, the bank defining an emission area; a pixel electrode in the emission area; and a first source-drain electrode pattern that is electrically connected to the pixel electrode, the first source-drain electrode pattern closer to the substrate than the pixel electrode and non-overlapping with a portion of the pixel electrode that is between ends of the pixel electrode.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
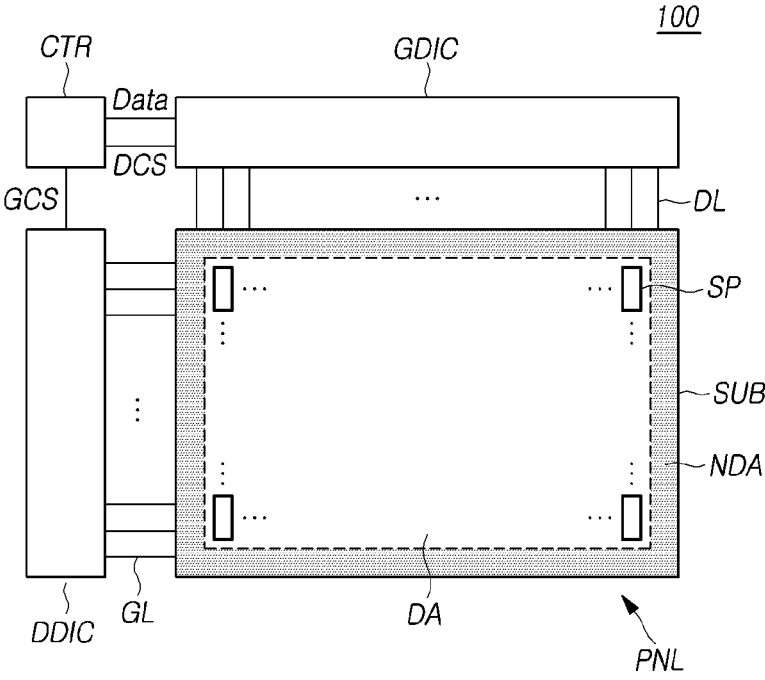
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of a display device 100 according to embodiments of the present disclosure.

Referring to FIG. 1, the display device 100 according to embodiments of the present disclosure may include a display panel PNL and a driving circuit for driving the display panel PNL.

The driving circuit may include a data driving circuit DDIC and a gate driving circuit GDIC and may further include a controller CTR for controlling the data driving circuit DDIC and the gate driving circuit GDIC.

The display panel PNL may include a substrate SUB and signal lines such as a plurality of data lines DL and a plurality of gate lines GL disposed on the substrate SUB. The display panel PNL may include a plurality of subpixels SP connected to the plurality of data lines DL and the plurality of gate lines GL.

The display panel PNL may include a display area DA in which an image is displayed and a non-display area NDA in which an image is not displayed. In the display panel PNL, the plurality of subpixels SP for displaying an image may be disposed in the display area DA. In the non-display area NDA, the driving circuits DDIC and GDIC and the controller CTR may be electrically connected or mounted, and a pad portion to which an integrated circuit or a printed circuit is connected may also be disposed.

The data driving circuit DDIC may be a circuit for driving the plurality of data lines DL and may supply data signals to the plurality of data lines DL. The gate driving circuit GDIC may be a circuit for driving the plurality of gate lines GL and may supply gate signals to the plurality of gate lines GL. The controller CTR may supply a data control signal DCS to the data driving circuit DDIC to control an operation timing of the data driving circuit DDIC. The controller CTR may supply a gate control signal GCS to the gate driving circuit GDIC to control an operation timing of the gate driving circuit GDIC.

The controller CTR may start a scan according to a timing implemented in each frame. The controller CTR may convert input image data input from an external device to be suitable for a data signal format used by the data driving circuit DDIC, may supply the converted image data to the data driving circuit DDIC, and may control data driving at an appropriate time according to the scan.

In order to control the gate driving circuit GDIC, the controller CTR may output various gate control signals GCS including gate start pulse (GSP), gate shift clock (GSC), and gate output enable (GOE) signals.

In order to control the data driving circuit DDIC, the controller CTR may output various data control signals DCS including source start pulse (SSP), source sampling clock (SSC), and source output enable (SOE) signals.

The controller CTR may be implemented as a separate component from the data driving circuit DDIC or may be integrated with the data driving circuit DDIC and implemented as an integrated circuit.

The data driving circuit DDIC receives image data DATA from the controller CTR and supplies data voltages to the plurality of data lines DL to drive the plurality of data lines DL. Here, the data driving circuit DDIC is also referred to as a source driving circuit.

The data driving circuit DDIC may include one or more source driver integrated circuits (SDICs).

For example, each SDIC may be connected to the display panel PNL as a tape automated bonding (TAB) type, may be connected to a bonding pad of the display panel PNL as a chip-on-glass (COG) or chip-on-panel (COP) type, or may be implemented as a chip-on-film (COF) type and connected to the display panel PNL.

The gate driving circuit GDIC may output a gate signal having a turn-on level voltage or a gate signal having a turn-off level voltage under the control of the controller CTR. The gate driving circuit GDIC may sequentially drive the plurality of gate lines GL by sequentially supplying a gate signal having a turn-on level voltage to the plurality of gate lines GL.

The gate driving circuit GDIC may be connected to the display panel PNL as a TAB type, may be connected to a bonding pad of the display panel PNL as a COG or COP type, or may be connected to the display panel PNL as a COF type. Alternatively, the gate driving circuit GDIC may be formed in the non-display area NDA of the display panel PNL in a gate-in-panel (GIP) type. The gate driving circuit GDIC may be disposed on or connected to the substrate SUB. That is, when the gate driving circuit GDIC is the GIP type, the gate driving circuit GDIC may be disposed in the non-display area NDA of the substrate SUB. When the gate driving circuit GDIC is the COG type, the COF type, or the like, the gate driving circuit GDIC may be connected to the substrate SUB.

Meanwhile, at least one driving circuit of the data driving circuit DDIC and the gate driving circuit GDIC may be disposed in the display area DA. For example, at least one driving circuit of the data driving circuit DDIC and the gate driving circuit GDIC may be disposed to not overlap the subpixels SP or may be disposed such that a portion or the entirety thereof overlaps the subpixels SP.

When a specific gate line GL is opened by the gate driving circuit GDIC, the data driving circuit DDIC may convert the image data DATA received from the controller CTR into an analog data voltage and may supply the analog data voltage to the plurality of data lines DL.

The data driving circuit DDIC may be connected to one side (for example, an upper or lower side) of the display panel PNL. According to a driving method, a panel design method, or the like, the data driving circuit DDIC may be connected to two sides (for example, the upper and lower sides) of the display panel PNL or may be connected to two or more sides of the four sides of the display panel PNL.

The gate driving circuit GDIC may be connected to one side (for example, a left side or a right side) of the display panel PNL. According to a driving method, a panel design method, or the like, the gate driving circuit GDIC may be connected to two sides (for example, the left and right sides) of the display panel PNL or may be connected to two or more sides of the four sides of the display panel PNL.

The controller CTR may be a timing controller used in typical display technology, may be a control device, which may include the timing controller, to further perform other control functions, may be a control device different from the timing controller, or may be a circuit inside a control device. The controller CTR may be implemented with various circuits or electronic components such as an integrated circuit (IC), a field programmable gate array (FPGA), an application specific integrated circuit (ASIC), and a processor.

The controller CTR may be mounted on a printed circuit board, a flexible printed circuit, or the like and may be electrically connected to the data driving circuit DDIC and the gate driving circuit GDIC through the printed circuit board or the flexible printed circuit.

The display device 100 according to the present embodiments may be a display including a backlight unit such as a liquid crystal display or may be a self-luminous display such as an organic light-emitting diode (OLED) display, a quantum dot display, or a micro light-emitting diode (micro LED) display.

When the display device 100 according to the present embodiments is the OLED display, each subpixel SP may include an OLED, which emits light by itself, as a light-emitting element. When the display device 100 according to the present embodiments is the quantum dot display, each subpixel SP may include a light-emitting element made of quantum dots which are a semiconductor crystal that emits light by itself. When the display device 100 according to the present embodiments is the micro LED display, each sub-pixel SP may include a micro LED, which emits light by itself and is made based on an inorganic material, as a light-emitting element.

Figure 2:
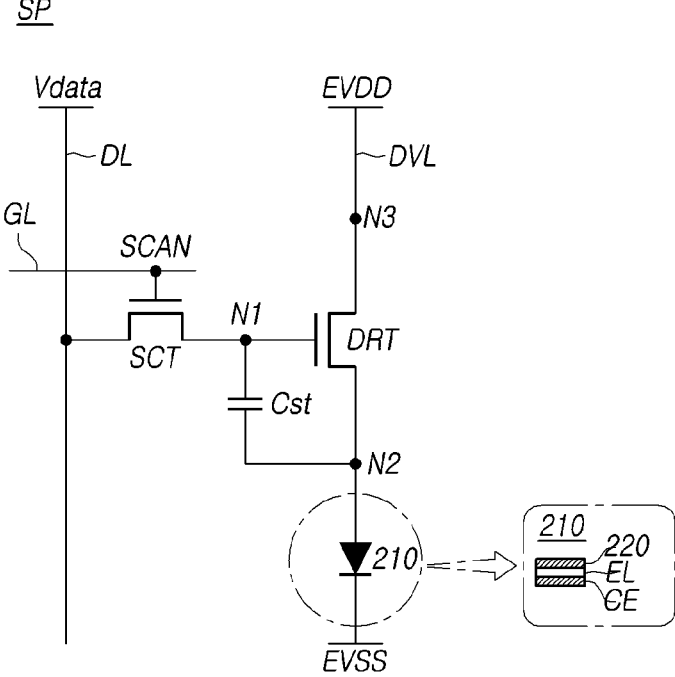
FIG. 2 is a circuit diagram of a subpixel of a display device according to embodiments of the present disclosure.

FIG. 2 is an equivalent circuit of a subpixel SP of a display device 100 according to embodiments of the present disclosure.

Referring to FIG. 2, each of a plurality of subpixels SP disposed on a display panel PNL of the display device 100 according to embodiments of the present disclosure may include a light-emitting element 210, a driving transistor DRT, a scan transistor SCT, and a storage capacitor Cst.

Referring to FIG. 2, the light-emitting element 210 may include a pixel electrode 220 and a common electrode CE and may include a light-emitting layer EL positioned between the pixel electrode 220 and the common electrode CE.

The pixel electrode 220 of the light-emitting element 210 may be an electrode disposed in each subpixel SP, and the common electrode CE may be an electrode commonly disposed in all the subpixels SP. Here, the pixel electrode 220 may be an anode, and the common electrode CE may be a cathode. On the contrary, the pixel electrode 220 may be a cathode, and the common electrode CE may be an anode.

For example, the light-emitting element 210 may be an OLED, an LED, or a quantum dot light-emitting element.

The driving transistor DRT may be a transistor for driving the light-emitting element 210 and may include a first node N1, a second node N2, and a third node N3.

The first node N1 of the driving transistor DRT may be a gate node of the driving transistor DRT and may be electrically connected to a source node or a drain node of the scan transistor SCT. The second node N2 of the driving transistor DRT may be the source node or the drain node of the driving transistor DRT, may be electrically connected to the source node or the drain node of a sensing transistor SENT, and may also be electrically connected to the pixel electrode 220 of the light-emitting element 210. The third node N3 of the driving transistor DRT may be electrically connected to a driving voltage line DVL for supplying a driving voltage EVDD.

The scan transistor SCT may be controlled by a scan signal SCAN that is a type of a gate signal and may be connected between the first node N1 of the driving transistor DRT and a data line DL. In other words, the scan transistor SCT may be turned on or turned off according to the scan signal SCAN supplied from a scan signal line SCL, which is a type of a gate line GL, to control a connection between the data line DL and the first node N1 of the driving transistor DRT.

The scan transistor SCT may be turned on by the scan signal SCAN having a turn-on level voltage to transmit a data voltage Vdata supplied from the data line DL to the first node N1 of the driving transistor DRT.

Here, when the scan transistor SCT is an n-type transistor, the turn-on level voltage of the scan signal SCAN may be a high level voltage. When the scan transistor SCT is a p-type transistor, the turn-on level voltage of the scan signal SCAN may be a low level voltage.

The storage capacitor Cst may be connected between the first node N1 and the second node N2 of the driving transistor DRT. The storage capacitor Cst is charged with a quantity of electric charge corresponding to a voltage difference between both ends thereof and serves to maintain the voltage difference between both ends for a set frame time. Accordingly, for the set frame time, the corresponding subpixel SP may emit light.

A display device according to embodiments of the present disclosure includes an emission area, a pixel electrode, and a first source-drain electrode pattern.

Figure 3:
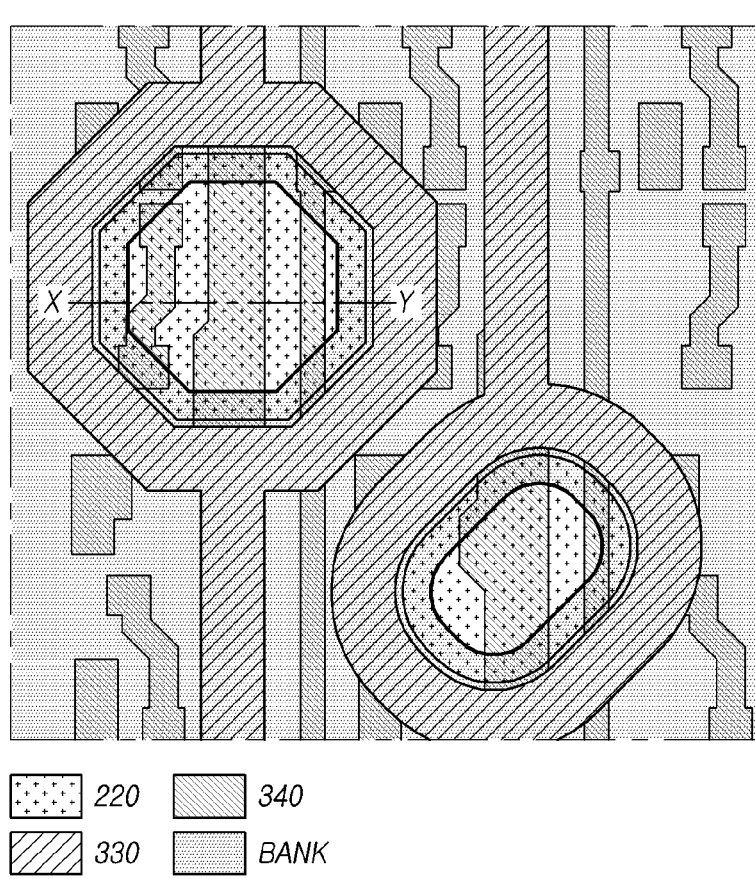
FIGS. 3 and 4 are plan views of a display device according to embodiments of the present disclosure.
Figure 4:
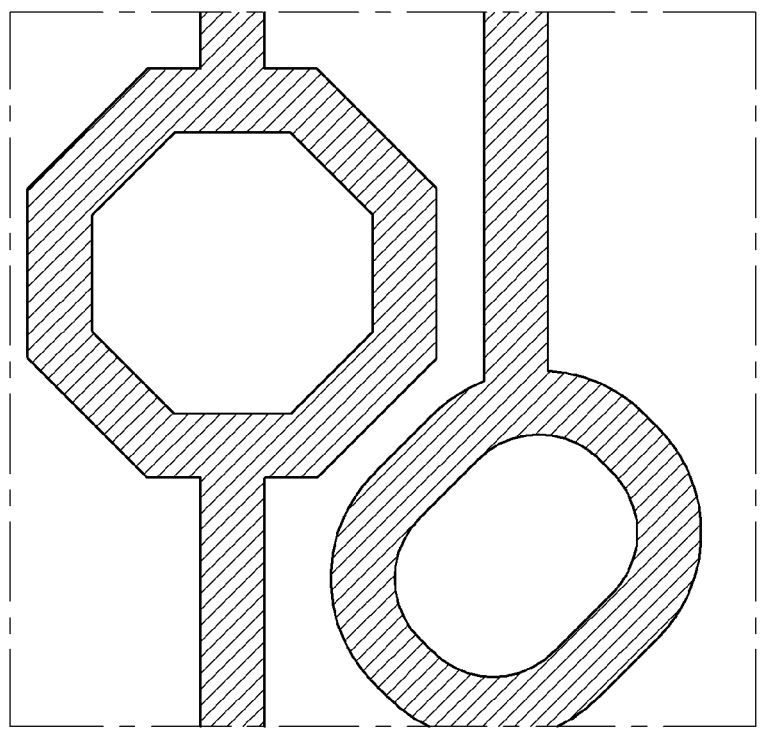

FIGS. 3 and 4 are plan views of a display device according to embodiments of the present disclosure.

Referring to FIG. 3, the display device may include a pixel electrode 220, a first source-drain electrode pattern 330, a second source-drain electrode pattern 340, and a bank BANK.

At least a portion of the pixel electrode 220 is positioned in an emission area. The emission area may be defined by the bank BANK and may be an opening area of the bank BANK in which the bank BANK is open. In one embodiment, light is emitted in the emission area.

The first source-drain electrode pattern 330 may be an electrode pattern layer which electrically connects the pixel electrode 220 of a light-emitting element included in the display device and a source-drain electrode of a transistor constituting a pixel circuit. The first source-drain electrode pattern 330 may be the same material layer positioned on one layer or the same material layer formed through one patterning process. A material layer constituting the first source-drain electrode pattern 330 may be used as various circuit elements and lines included in the display device in addition to a function of connecting the source-drain electrode of the transistor to the light-emitting element. For example, a portion of the first source-drain electrode pattern 330 may be a pattern layer connected directly to the pixel electrode 220 of the light-emitting element.

The first source-drain electrode pattern 330 includes a first bypass portion which has a ring shape and bypasses a central portion of the emission area. In one embodiment, the first bypass portion of the first source-drain electrode pattern 330 surrounds the central portion of the emission area in a plan view of the display device so that the first source-drain electrode pattern 330 is non-overlapping with the pixel electrode 220. Since the first source-drain electrode pattern 330 includes the first bypass portion which bypasses the central portion of the emission area, the first source-drain electrode pattern 330 is not positioned below the pixel electrode 220 in the emission area in which the bank BANK is open. Accordingly, since the first source-drain electrode pattern 330 is not positioned below the pixel electrode 220, it is possible to prevent or at least reduce a rainbow mura phenomenon from occurring when a cross-sectional shape of the pixel electrode 220 is convex.

The first source-drain electrode pattern 330 may be positioned to not overlap the pixel electrode 220. When the first source-drain electrode pattern 330 is positioned to not overlap the pixel electrode 220, since the cross-sectional shape of the pixel electrode 220 may be substantially a flat shape, it is possible to prevent a rainbow mura phenomenon caused by reflection of light from a pixel electrode having a convex shape.

The second source-drain electrode pattern 340 may be an electrode pattern layer which electrically connects the pixel electrode 220 of the light-emitting element included in the display device and the source-drain electrode of the transistor constituting the pixel circuit. The second source-drain electrode pattern 340 may be a different pattern layer from the first source-drain electrode pattern 330. The second source-drain electrode pattern 340 may be the same material layer positioned on one layer or the same material layer formed through one patterning process. A material layer constituting the second source-drain electrode pattern 340 may be used as various circuit elements and lines included in the display device in addition to a function of connecting the source-drain electrode of the transistor to the light-emitting element. For example, the second source-drain electrode pattern 340 may be positioned closer to a substrate than the first source-drain electrode pattern 330, and a portion thereof may be a pattern layer which electrically connects the first source-drain electrode pattern 330 to the source-drain electrode of the transistor constituting the pixel circuit.

Referring to FIG. 4, it can be seen that the first source-drain electrode pattern 330 includes the first bypass portion having the ring shape. In the present disclosure, the ring shape may be any shape in which a central portion thereof is perforated and may be any shape in which the first source-drain electrode pattern 330 can bypass the central portion of the emission area.

Figure 5:
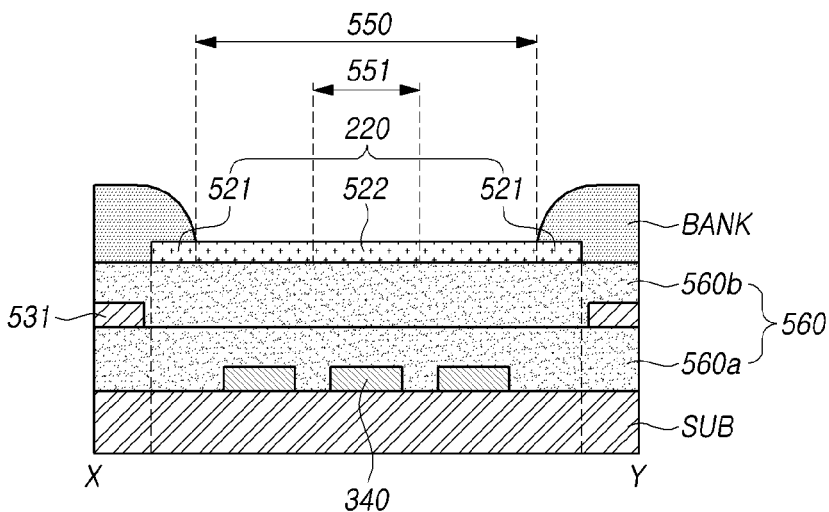
FIG. 5 is a cross-sectional view along line X-Y of FIG. 3 according to embodiments of the present disclosure.

FIG. 5 is a cross-sectional view along line X-Y of FIG. 3 according to one embodiment.

Referring to FIG. 5, the display device includes an emission area 550, the pixel electrode 220, and the first source-drain electrode pattern including a first bypass portion 531.

The emission area 550 may be an area of the substrate SUB in which light is emitted by the light-emitting element and may be defined by the bank BANK. The emission area 550 may be an area in which the light-emitting element is positioned and the bank BANK is open.

At least a portion of the pixel electrode 220 is positioned in the emission area. For example, the remaining portion of the pixel electrode 220 except for an area covered by the bank BANK may be positioned in the emission area 550. The light-emitting element may include the pixel electrode 220 and may be a top emission type.

The first source-drain electrode pattern may include the first bypass portion 531 which has a ring shape and bypasses a central portion 551 of the emission area. The central portion 551 is located between the ends of the emission area. The first bypass portion 531 may be a portion of the first source-drain electrode pattern 330 shown in FIG. 3 and may be a portion of the first source-drain electrode pattern which has a ring shape and bypasses the central portion of the emission area. That is, the first bypass portion 532 is non-overlapping with the pixel electrode 220.

Since the first source-drain electrode pattern includes the first bypass portion 531, the first source-drain electrode pattern may be positioned to not overlap the pixel electrode 220. That is, the first source-drain electrode pattern may be positioned to not overlap a central portion 522 and a peripheral portion 521 (e.g., ends) of the pixel electrode 220. That is, the first source-drain electrode pattern is non-overlapping with a portion of the pixel electrode 220 (e.g., the central portion 522) that is between ends of the pixel electrode 220. In such an example, the pixel electrode 220 may have substantially a flat shape, and a rainbow mura phenomenon occurring when the pixel electrode has a convex shape can be prevented.

In the present disclosure, the peripheral portion 521 of the pixel electrode 220 may be a portion of the pixel electrode 220 (e.g., ends) which does not overlap the emission area 550. The central portion 522 of the pixel electrode 220 may be a portion of the pixel electrode 220 except for the peripheral portion 521 of the pixel electrode 220. That is, the central portion 522 of the pixel electrode 220 may be a portion of the pixel electrode 220 between the ends of the pixel electrode 220

The first source-drain electrode pattern may be the same material layer as an electrode formed to electrically connect a source-drain electrode of a transistor positioned on a substrate SUB and the pixel electrode 220. The first source-drain electrode pattern may include a portion used as portions of various lines and circuit elements of the display device in addition to a portion used for electrically connecting the source-drain of the transistor and the pixel electrode.

A first planarization layer 560a may be positioned on the substrate SUB, a second planarization layer 560b may be positioned on the first planarization layer 560a, and the bank BANK may be positioned on the second planarization layer 560b.

The second source-drain electrode pattern 340 may be positioned on the substrate SUB. The second source-drain electrode pattern 340 may be the same material layer as an electrode formed to connect the source-drain electrode of the transistor positioned on the substrate SUB and the pixel electrode 220 and may be a pattern positioned on a different layer from a layer on which the first source-drain electrode pattern is positioned. The second source-drain electrode pattern may include a portion used as portions of various lines and circuit elements of the display device in addition to a portion used for electrically connecting the source-drain of the transistor and the pixel electrode.

In embodiments in which the first source-drain electrode pattern and the second source-drain electrode pattern 340 are included, since the first source-drain electrode pattern positioned closer to the pixel electrode 220 includes the first bypass portion 531 which bypasses the central portion 551 of the emission area 550, it is possible to more effectively prevent or at least reduce a rainbow mura shape from occurring when the pixel electrode 220 has a convex shape.

The second source-drain electrode pattern 340 may be electrically connected to the pixel electrode 220 by the first source-drain electrode pattern. Since the first source-drain electrode pattern 330 is positioned between the second source-drain electrode pattern 340 and the pixel electrode 220, the second source-drain electrode pattern 340 may be electrically connected to the pixel electrode by the first source-drain electrode pattern.

The first source-drain electrode pattern 330 and the second source-drain electrode pattern 340 may be positioned on different layers. It can be seen that the first bypass portion 531 that is a portion of the first source-drain electrode pattern 330 is positioned on a different layer from the second source-drain electrode pattern 340.

The first source-drain electrode pattern 330 may be positioned closer to the pixel electrode 220 than the second source-drain electrode pattern 340. The fact that the first source-drain electrode pattern 330 is positioned closer to the pixel electrode 220 than the second source-drain electrode pattern 340 may mean that a layer (first planarization layer 560a in FIG. 5) on which the first source-drain electrode pattern 330 is positioned is closer to the pixel electrode than a layer (substrate SUB in FIG. 5) on which the second source-drain electrode pattern 340 is positioned. It can be seen that the first bypass portion 531 that is a portion of the first source-drain electrode pattern 330 is positioned closer to the pixel electrode 200 than the second source-drain electrode pattern 340.

The second source-drain electrode pattern 340 may pass through the central portion 551 of the emission area 550. That is, the second source-drain electrode pattern 340 overlaps the central portion 551 of the emission area 550. For example, since the second source-drain electrode pattern 340 is positioned farther from the pixel electrode 220 than the first source-drain electrode pattern, and two planarization layers 560a and 560b are disposed between the second source-drain electrode pattern 340 and the pixel electrode 220, even when the second source-drain electrode pattern 340 passes through the central portion of the emission area 550 in which the pixel electrode 220 is positioned, the pixel electrode 220 does not have a convex shape so that a rainbow mura phenomenon does not occur.

Figure 6:
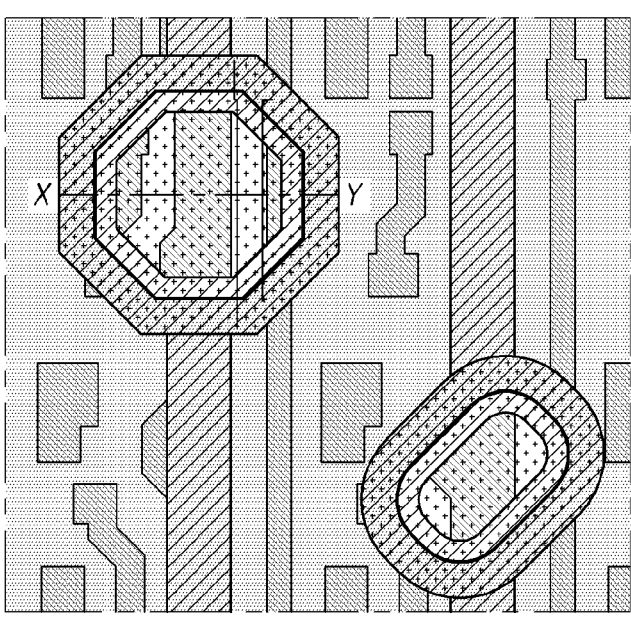
FIGS. 6 and 7 are plan views of a display device according to embodiments of the present disclosure.
Figure 6:
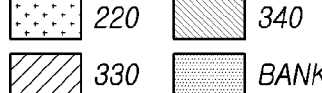
Figure 7:
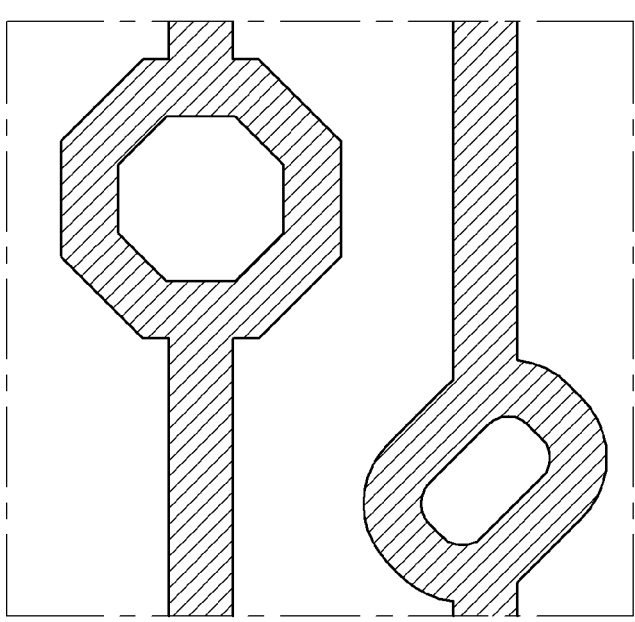

FIGS. 6 and 7 are plan views of a display device according to embodiments of the present disclosure.

Referring to FIG. 6, at least a portion of a pixel electrode 220 may be positioned in an emission area in which a bank BANK is open, and a first source-drain electrode pattern 330 may be positioned such that a first bypass portion overlaps a peripheral portion of the pixel electrode 220.

Referring to FIG. 7, it can be seen that the first source-drain electrode pattern 330 includes the first bypass portion having a ring shape. However, compared with that of FIG. 4, it can be seen that the first source-drain electrode pattern

330 of FIG. 7 is positioned to overlap the peripheral portion of the pixel electrode, and a size of the first bypass portion is relatively smaller.

Figure 8:
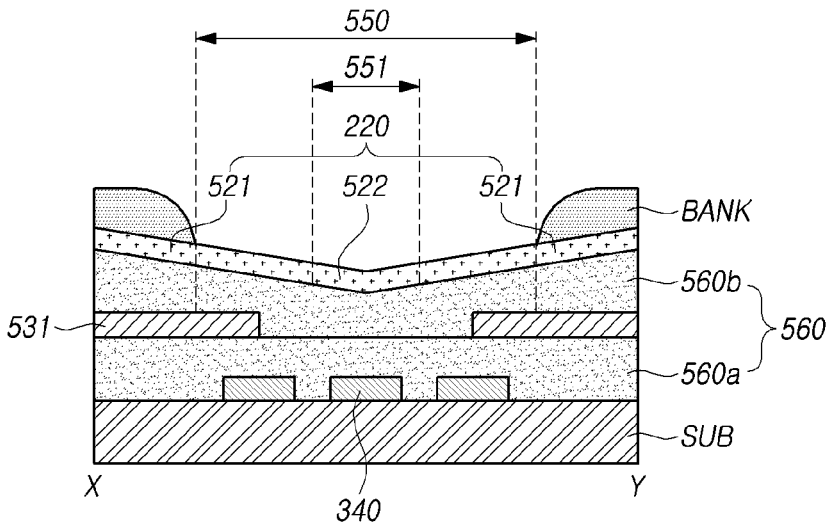
FIG. 8 is a cross-sectional view along line X-Y of FIG. 6 according to embodiments of the present disclosure.

FIG. 8 is a cross-sectional view along line X-Y of FIG. 6 according to one embodiment.

Referring to FIG. 8, a first bypass portion 531 of the first source-drain electrode pattern 330 may be positioned to overlap a peripheral portion 521 (e.g., the ends) of the pixel electrode 220. When the first bypass portion 531 is positioned to overlap the peripheral portion of the pixel electrode 220, a central portion 522 of the pixel electrode 220 may have a concave shape. When the central portion of the pixel electrode 220 has the concave shape, it is possible to prevent a rainbow mura phenomenon caused by light reflected from the concave pixel electrode 220.

The first bypass portion 531 of the first source-drain electrode pattern may be positioned to overlap a peripheral portion of an emission area 550.

The first bypass portion 531 of the first source-drain electrode pattern may be positioned to not overlap the central portion 522 of the pixel electrode 220.

Figure 9:
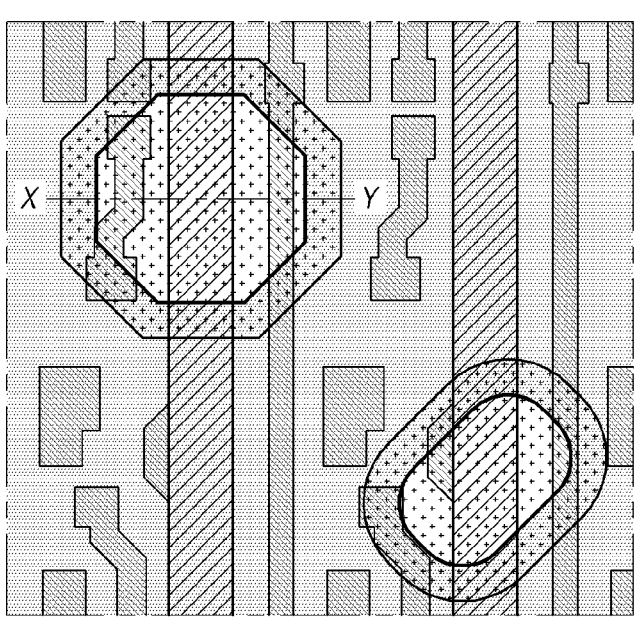
FIG. 9 is a plan view of a display device according to a comparative example of the present disclosure.
Figure 9:

FIG. 9 is a plan view of a display device according to a comparative example of the present disclosure.

Referring to FIG. 9, the display device may include a pixel electrode PE, a first source-drain electrode pattern SD1, a second source-drain electrode pattern SD2, and a bank BANK.

The first source-drain electrode pattern SD1 may be positioned to overlap the pixel electrode PE. When the first source-drain electrode pattern SD1 is positioned to overlap the pixel electrode PE, a rainbow mura phenomenon occurs due to light that is reflected from the pixel electrode.

Figure 10:
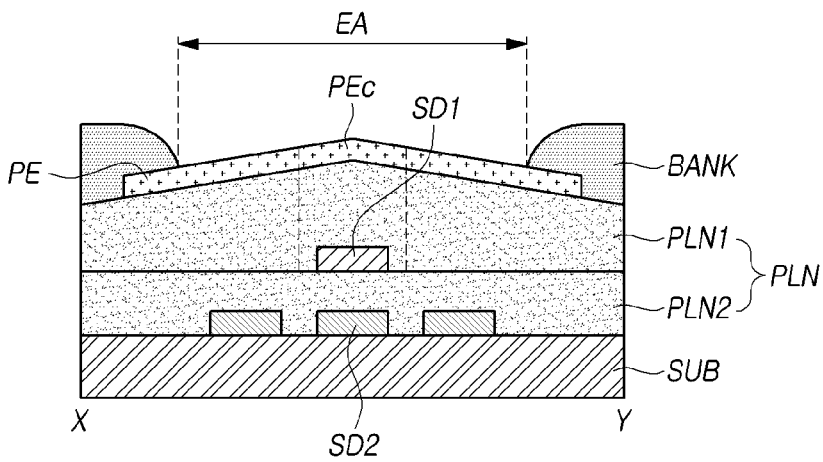
FIG. 10 is a cross-sectional view along line X-Y of FIG. 9 according to embodiments of the present disclosure.

FIG. 10 is a cross-sectional view along line X-Y of FIG. 9.

Referring to FIG. 10, in the display device according to the comparative example, the first source-drain electrode pattern SD1 is positioned below the pixel electrode PE without bypassing a central portion of an emission area EA. Thus, the first source-drain electrode pattern SD1 overlaps the central portion of an emission area EA. A portion of a first planarization layer PLN1 at which the first source-drain electrode pattern SD1 is positioned may have a convex shape by the first source-drain electrode pattern SD1. Accordingly, a central portion PEc of the pixel electrode PE positioned on the first planarization layer PLN1 has a convex shape. When the central portion of the pixel electrode PE has the convex shape, a rainbow mura phenomenon occurs due to light reflected from the pixel electrode PE.

Figure 11:
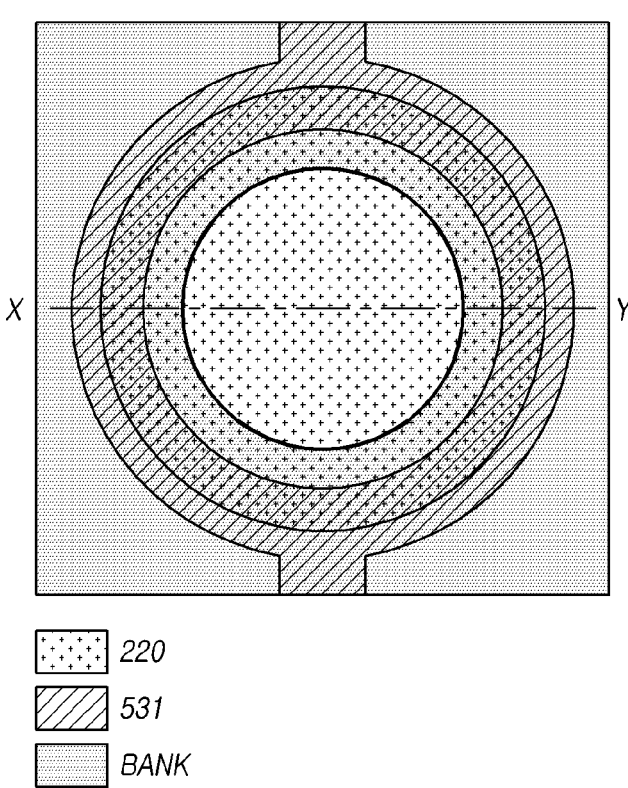
FIG. 11 is a plan view of a display device according to embodiments of the present disclosure.

FIG. 11 is a plan view of a display device according to embodiments of the present disclosure.

Referring to FIG. 11, a first bypass portion 531 of a first source-drain electrode pattern may be positioned to overlap a peripheral portion of a pixel electrode 220.

Figure 12:
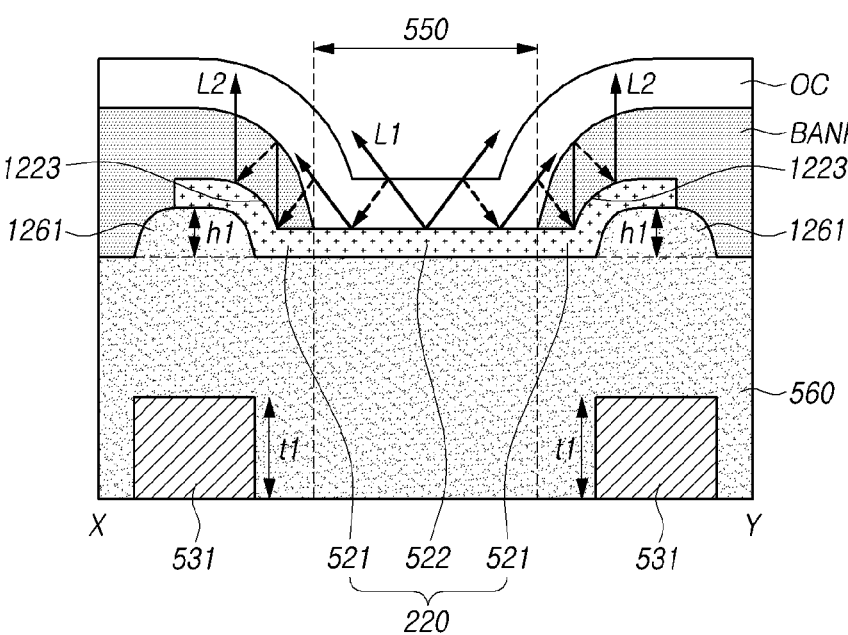
FIG. 12 is a cross-sectional view along line X-Y of FIG. 11 according to embodiments of the present disclosure.

FIG. 12 is a cross-sectional view along line X-Y of FIG. 11 according to one embodiment.

Referring to FIG. 12, the display device may include a planarization layer 560, the pixel electrode 220, a bank BANK, and an overcoat layer OC. The planarization layer 560 may be positioned between the pixel electrode 220 and the first source-drain electrode pattern including the first bypass portion 531.

When the display device includes a plurality of planarization layers, the planarization layer 560 may be a planarization layer on which the pixel electrode 220 constituting a light-emitting element is positioned.

The first bypass portion 531 of the first source-drain electrode pattern may be positioned to overlap a peripheral portion 521 of the pixel electrode 220. The planarization layer 560 may include a convex portion 1261 due to the first bypass portion 531. The convex portion 1261 may surround an emission area 550 and may overlap the first bypass portion 531.

The pixel electrode 220 may be positioned on the planarization layer 560. The pixel electrode 220 may include an inclined portion 1223 surrounding the emission area 550. When a portion of light L1 is reflected from the overcoat layer OC to travel toward a peripheral portion of the emission area 550, the portion of the light L1 may travel toward the inclined portion 1223 of the pixel electrode 220. Light L2 may be reflected from the inclined portion 1223 of the pixel electrode to be extracted to the outside of the display device. Accordingly, the efficiency of the display device can be increased by the inclined portion 1223.

A thickness t1 of the first bypass portion 531 may be greater than a height (e.g., thickness) of the convex portion 1261. When the thickness of the first bypass portion 531 is greater than the height of the convex portion 1261, the inclined portion 1223 of the pixel electrode 220 may be formed to have a height sufficient to extract the light L2 to the outside of the display device, thereby increasing the efficiency of the display device.

The display device may include the first source-drain electrode pattern and a second source-drain electrode pattern. The first source-drain electrode pattern may be a source-drain electrode pattern including the first bypass portion 531 and may be a source-drain electrode pattern positioned closer to the pixel electrode 220 than the second source-drain electrode pattern. For example, the planarization layer 560 may be provided as the plurality of planarization layers, the first source-drain electrode pattern and the second source-drain electrode pattern are positioned on different planarization layers, and the planarization layer on which the first source-drain electrode pattern is positioned may be positioned closer to the pixel electrode 220 than the planarization layer on which the second source-drain electrode pattern is positioned.

The first bypass portion 531 may be thicker than the second source-drain electrode pattern. When the first bypass portion 531 is thicker than the second source-drain electrode pattern positioned farther from the pixel electrode 220 than the first bypass portion 531, the convex portion 1261 of the planarization layer 560 may be formed to have a sufficient height so that the inclined portion 1223 of the pixel electrode 220 can more efficiently extract the light L2 to the outside of the display device.

Figure 13:
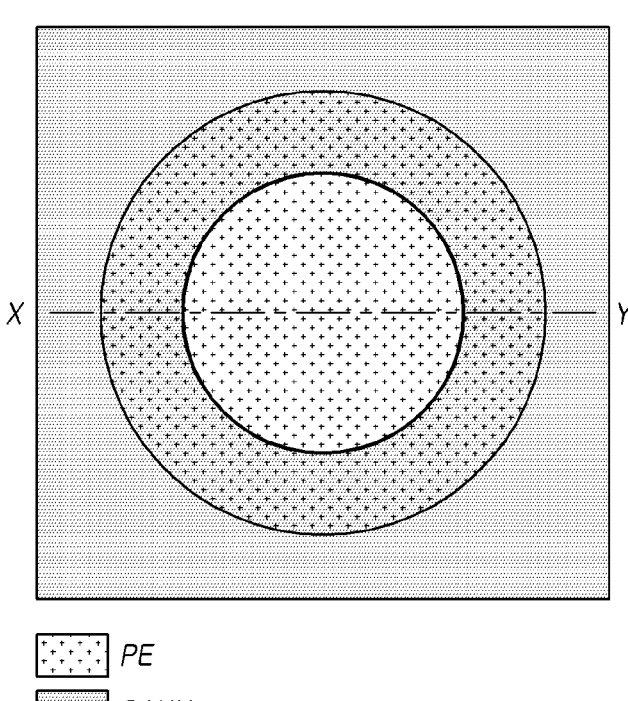
FIG. 13 is a plan view of a display device according to comparative examples of the present disclosure.

FIG. 13 is a plan view of a display device according to comparative examples of the present disclosure.

Referring to FIG. 13, a pixel electrode PE may be positioned, and a bank BANK may be positioned on the pixel electrode PE. A portion of the bank BANK may be open to expose a portion of the pixel electrode PE. In the comparative example of FIG. 13, unlike that shown in FIG. 11, a source-drain electrode pattern is not positioned below the pixel electrode PE.

Figure 14:
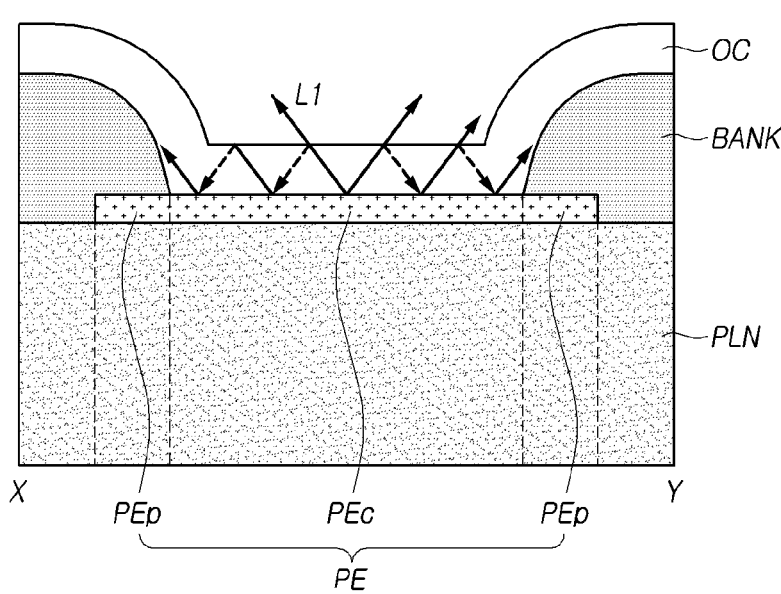
FIG. 14 is a cross-sectional view along line X-Y of FIG. 13 according to embodiments of the present disclosure.

FIG. 14 is a cross-sectional view along line X-Y of FIG. 13.

Referring to FIG. 14, the display device may include a planarization layer PLN, the pixel electrode PE, the bank BANK, and an overcoat layer OC.

In the display device of the comparative example, the source-drain electrode pattern is not positioned below a central portion PEc of the pixel electrode and below a peripheral portion PEp of the pixel electrode. Accordingly, the planarization layer PLN is formed to have substantially a flat shape. Since the pixel electrode PE formed on the planarization layer PLN is formed along a surface of the planarization layer PLN, the pixel electrode PE does not include an inclined portion unlike the display device according to the embodiments of FIG. 12. Accordingly, the display device according to the comparative example emits only light L1 to the outside of the display device and does not extract light, which is reflected by the overcoat layer OC to travel toward a peripheral portion of an emission area, to the outside of the display device. Accordingly, the display device according to the comparative example has lower efficiency than the display device according to the embodiments.

Figure 15:
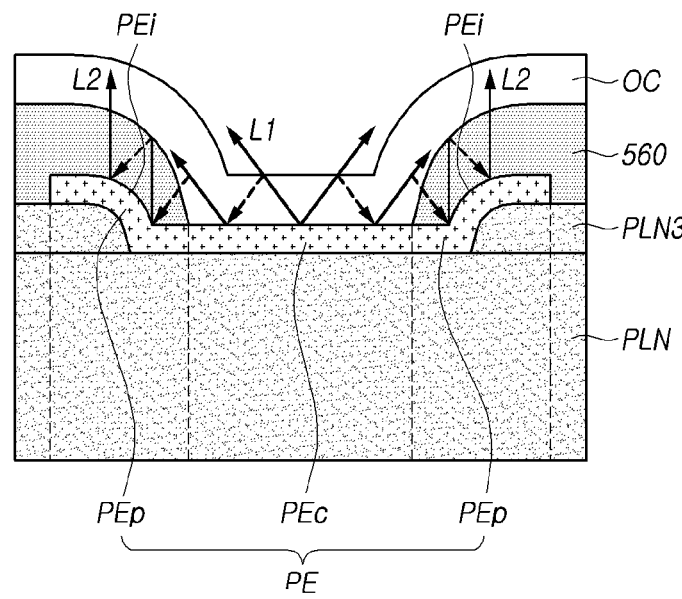
FIG. 15 is a cross-sectional view of a display device according to a comparative example of the present disclosure.

FIG. 15 is a cross-sectional view along line X-Y of FIG. 13.

Referring to the comparative example of FIG. 15, unlike the comparative example of FIG. 14, a third planarization layer PLN3 which is an additional planarization layer is included. The third planarization layer PLN3 is a planarization layer disposed on a planarization layer PLN and is a planarization layer disposed below a peripheral portion of the pixel electrode PE.

The pixel electrode PE includes an inclined portion PEi due to the third planarization layer PLN3, and light L2 may be extracted by the inclined portion PEi. Therefore, the display device according to the comparative example can achieve excellent efficiency by extracting the light L2, but there is a problem in that a process of patterning the third planarization layer PLN3 is required that the pixel electrode PE has the inclined portion PEi, thereby increasing manufacturing costs.

On the other hand, according to the embodiments of the present disclosure shown in FIG. 12, since a pixel electrode may include an inclined portion through a process of forming a source-drain electrode pattern for driving a circuit element such as a transistor of a display device, the display device according to the embodiments of the present disclosure has excellent display device efficiency and low manufacturing costs.

The above-described embodiments of the present disclosure will be briefly described below.

A display device 100 according to embodiments of the present disclosure includes an emission area 550, a pixel electrode 220, and a first source-drain electrode pattern 330.

At least a portion of the pixel electrode 220 is positioned in the emission area 550.

The first source-drain electrode pattern 330 includes a first bypass portion 531 which has a ring a shape and bypasses a central portion of the emission area 550.

The display device 100 may include a light-emitting element 210 which includes the pixel electrode 220 and is a top emission type.

The first bypass portion 531 may be positioned to not overlap the pixel electrode 220.

The first bypass portion 531 may be positioned to overlap a peripheral portion 521 of the pixel electrode 220.

The first bypass portion 531 may be positioned to overlap a peripheral portion of the emission area 550.

A central portion 522 of the pixel electrode 220 may have a concave shape.

The first bypass portion 531 may be positioned to not overlap a peripheral portion of the emission area 550.

The pixel electrode 220 may include an inclined portion 1223 configured to surround the emission area 550.

The display device 100 may include a planarization layer 560 positioned between the first source-drain electrode pattern 330 and the pixel electrode 220. In addition, the planarization layer 560 may include a convex portion 1261 which surrounds the emission area 550 and is positioned to overlap the first bypass portion 531.

A thickness of the first bypass portion 531 may be greater than a height of the convex portion 1261.

The display device 100 may include a second source-drain electrode pattern 340 electrically connected to the pixel electrode 220 by the first source-drain electrode pattern 330.

The first source-drain electrode pattern 330 and the second source-drain electrode pattern 340 may be positioned on different layers. In addition, the first source-drain electrode pattern 330 may be positioned closer to the pixel electrode 220 than the second source-drain electrode pattern 340.

A portion of the second source-drain electrode pattern 340 may pass through the central portion 551 of the emission area 550.

The first bypass portion 531 may be thicker than the second source-drain electrode pattern 340.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
an emission area;
a pixel electrode including at least a portion that is in the emission area; and
a first source-drain electrode pattern comprising a first bypass portion which has a ring shape that bypasses a central portion of the emission area, an inner edge of the ring shape of the first bypass portion overlapping with a bank defining the emission area.

2. The display device of claim 1, further comprising:
a light-emitting element including the pixel electrode,
wherein the light-emitting element is a top emission type.

3. The display device of claim 1, wherein the first bypass portion is non-overlapping with the pixel electrode.

4. The display device of claim 1, wherein the first bypass portion overlaps a peripheral portion of the pixel electrode, but not a central portion of the pixel electrode in the central portion of the emission area.

5. The display device of claim 4, wherein the first bypass portion overlaps a peripheral portion of the emission area that overlaps the peripheral portion of the pixel electrode.

6. The display device of claim 4, wherein a portion of the pixel electrode between ends of the pixel electrode has a concave shape.

7. The display device of claim 1, wherein the first bypass portion is non-overlapping with a peripheral portion of the emission area that overlaps a peripheral portion of the pixel electrode.

8. The display device of claim 4, wherein the pixel electrode comprises an inclined portion that surrounds the emission area.

9. The display device of claim 8, further comprising:
a planarization layer between the first source-drain electrode pattern and the pixel electrode, the planarization layer including a convex portion that surrounds the emission area and overlaps the first bypass portion and the inclined portion of the pixel electrode.

10. The display device of claim 9, wherein a thickness of the first bypass portion is greater than a thickness of the convex portion.

11. The display device of claim 1, further comprising:
a second source-drain electrode pattern.

12. The display device of claim 11, wherein the first source-drain electrode pattern is on a different layer from the second source-drain electrode pattern such that the first source-drain electrode pattern is closer to the pixel electrode than the second source-drain electrode pattern.

13. The display device of claim 11, wherein a portion of the second source-drain electrode pattern overlaps the central portion of the emission area.

14. The display device of claim 11, wherein the first bypass portion has a thickness that is greater than a thickness of the second source-drain electrode pattern.

15. A display device comprising:
a substrate including an emission area;
a pixel electrode in the emission area;
a first source-drain electrode pattern that is electrically connected to the pixel electrode, the first source-drain electrode pattern including a portion that surrounds a portion of the pixel electrode that is between ends of the pixel electrode such that the first source-drain electrode pattern is non-overlapping with the portion of the pixel electrode, wherein the portion of the first source-drain electrode pattern surrounding the portion of the pixel electrode between the ends of the pixel electrode overlaps with a bank defining the emission area,
wherein the first source-drain electrode pattern is located closer to the substrate than the pixel electrode, and
wherein a distance between outmost edges of the first source-drain electrode pattern opposing each other is greater than a distance between outmost edges of the pixel electrode opposing each other in a plan view of the display device.

16. The display device of claim 15, wherein the portion of the pixel electrode is a central portion of the pixel electrode and the portion of the first source-drain electrode pattern comprises a ring shape that surrounds the central portion of the pixel electrode.

17. The display device of claim 15, wherein the pixel electrode is included in a light-emitting element that is configured to emit light in the emission area.

18. The display device of claim 15, wherein the first source-drain electrode pattern is non-overlapping with the ends of the pixel electrode and the portion of the pixel electrode that is between the ends of the pixel electrode.

19. The display device of claim 15, wherein the first source-drain electrode pattern overlaps the ends of the pixel electrode but is non-overlapping with the portion of the pixel electrode that is between the ends of the pixel electrode.

20. The display device of claim 19, wherein the portion of the pixel electrode between the ends of the pixel electrode is concave.

21. The display device of claim 15, wherein the pixel electrode comprises an inclined portion that surrounds the emission area and the display device further comprising:

a planarization layer between the first source-drain electrode pattern and the pixel electrode, the planarization layer including a convex portion that surrounds the emission area and overlaps the first bypass portion and the inclined portion of the pixel electrode.

22. The display device of claim 15, further comprising:

a second source-drain electrode pattern that is on a different layer than the first source-drain electrode pattern, the second source-drain electrode pattern overlapping with the portion of the pixel electrode that is between ends of the pixel electrode.

23. The display device of claim 15, wherein the pixel electrode is included in a light-emitting element that is configured to emit light in the emission area.

24. The display device of claim 15, wherein the first source-drain electrode pattern is non-overlapping with the ends of the pixel electrode and the portion of the pixel electrode that is between the ends of the pixel electrode.

25. The display device of claim 15, wherein the first source-drain electrode pattern overlaps the ends of the pixel electrode but is non-overlapping with the portion of the pixel electrode that is between the ends of the pixel electrode.

26. The display device of claim 15, further comprising:

a second source-drain electrode pattern that is closer to the substrate than the first source-drain electrode pattern, the second source-drain electrode pattern electrically connected to the pixel electrode via the first source-drain electrode pattern and is overlapping with the portion of the pixel electrode that is between ends of the pixel electrode.

27. The display device of claim 15, wherein the portion of the first source-drain electrode pattern surrounding the portion of the pixel electrode between the ends of the pixel electrode overlaps with a bank defining the emission area.

* * * * *